United States Patent [19]
Jonsen

[11] Patent Number: 5,036,279
[45] Date of Patent: Jul. 30, 1991

[54] PORTABLE NMR AND NQR SPECTROMETERS

[75] Inventor: Paul Jonsen, London, England

[73] Assignee: Datalight Limited, Hong Kong

[21] Appl. No.: 366,868

[22] Filed: May 4, 1989

Related U.S. Application Data

[63] Continuation of Ser. No. 192,344, May 11, 1988, abandoned.

[30] Foreign Application Priority Data

May 11, 1987 [GB] United Kingdom ................. 8711114

[51] Int. Cl.$^5$ ............................................. G01R 33/20
[52] U.S. Cl. .................................... 324/307; 324/248
[58] Field of Search ............... 324/248, 300, 307, 309, 324/311, 312, 313, 314, 316, 318, 322

[56] References Cited

U.S. PATENT DOCUMENTS

| | | | |
|---|---|---|---|
| 3,568,047 | 3/1971 | Look et al. | 324/307 |
| 4,442,404 | 4/1984 | Bergmann | 324/309 |
| 4,633,181 | 12/1986 | Boesch et al. | 324/322 |
| 4,758,789 | 7/1988 | Oho et al. | 324/316 |
| 4,906,607 | 3/1990 | Tyagi | 324/248 |

Primary Examiner—Michael J. Tokar

[57] ABSTRACT

A NMR/NQR spectrometer incorporating a superconducting quantum interference device (SQUID) made from mixed oxides of a lanthanide, copper and barium.

18 Claims, 1 Drawing Sheet

PORTABLE NMR AND NQR SPECTROMETERS

This is a continuation of application Ser. No. 192,344 filed May 11, 1988, and now abandoned.

BACKGROUND OF THE INVENTION

One large disadvantage of conventional NMR Spectrometers is that the detection system is based on Faraday's law. That is, the receiver coil only sees the rate of change of magnetic flux, this being larger at larger frequencies. Larger frequencies are achieved by immersion of the sample in very strong magnetic fields. As more capital is ploughed into the research and development of more powerful superconducting magnets, a few scientists have considered alternative detectors. These use the direct current (dc) superconducting quantum interference device (SQUID), details for which are (1) Claude Hilbert & John Clarke Appl. Phys. Lett. 43 694 (1983), and (2) Claude Hilbert John Clarke, Appl. Phys. Lett., 45 799 (1984). The dc SQUID detector is an alternative as it detects the magnitude of flux and is, therefore, independent of frequency and magnetic field strength.

Dc SQUID'S have been applied to a low noise radio-frequency amplifier (see U.S. Pat. No. 4,585,999).

The typical dc SQUID is a small device. However, conventional dc SQUID'S operate at liquid Helium temperatures (4.2 K.). To construct a NMR or NQR Spectrometer requires a helium cryostat in which to hold the SQUID and detection systems. In order to achieve adequate shielding and supply of liquid helium, this cryostat is quite large and not portable. Furthermore, to achieve further shielding from stray radio frequency fields, the SQUID detector has to be placed within a faraday cage.

Even though the dc SQUID Spectrometer is essentially more simple than the conventional NMR Spectrometer, this advantage is lost as the space required for the instrument is still large. The main drawbacks are, therefore, the dc SQUID operating temperature and the required r.f. shielding.

Recently, many new superconducting materials have been discovered based on the mixed oxides of a Lanthanide, copper and barium. These material are superconducting at liquid nitrogen temperatures (77 K.).

SUMMARY OF THE INVENTION

In accordance with the invention, a NMR or NQR Spectrometer incorporates a superconducting quantum interference device made from mixed oxides of a Lanthanide, copper and barium.

Such a SQUID manufactured with these materials, and operating at liquid nitrogen temperatures, would negate the need for a bulky cryostat. Liquid nitrogen can be held, at room temperatures, in a styrofoam container. This container could be within the confines of a portable box, which also constitutes the faraday shielding. Unlike NMR in high field magnets, simple experiments on solid samples do not require high power radio frequency amplifiers. Work by Gerry Chingas and A. Pines at Berkeley has shown that only a simple dc magnetic field, not of a great magnitude, can be used to initiate evolution of the nuclear spin system so a NMR Spectrum can be measured. The preferred equipment required would be: (a) high temperature (77 K.) dc SQUID; (b) container for liquid nitrogen cryogen; (c) tuned circuit for the observation of the frequencies of interest; (d) sample coil, within the tuned circuit; (e) dc magnet coil and power supply, battery or mains powered; (f) preamplifier for further amplification of the observed signal; (g) small computer to control the pulsing of the dc magnetic field and acquisition of data; (h) disk drive (floppy) for the transfer of data for manipulation on a larger computer; and (i) casing, which also screens the dc SQUID from stray radio frequency fields.

DETAILED DESCRIPTION OF THE INVENTION

Figure 1:
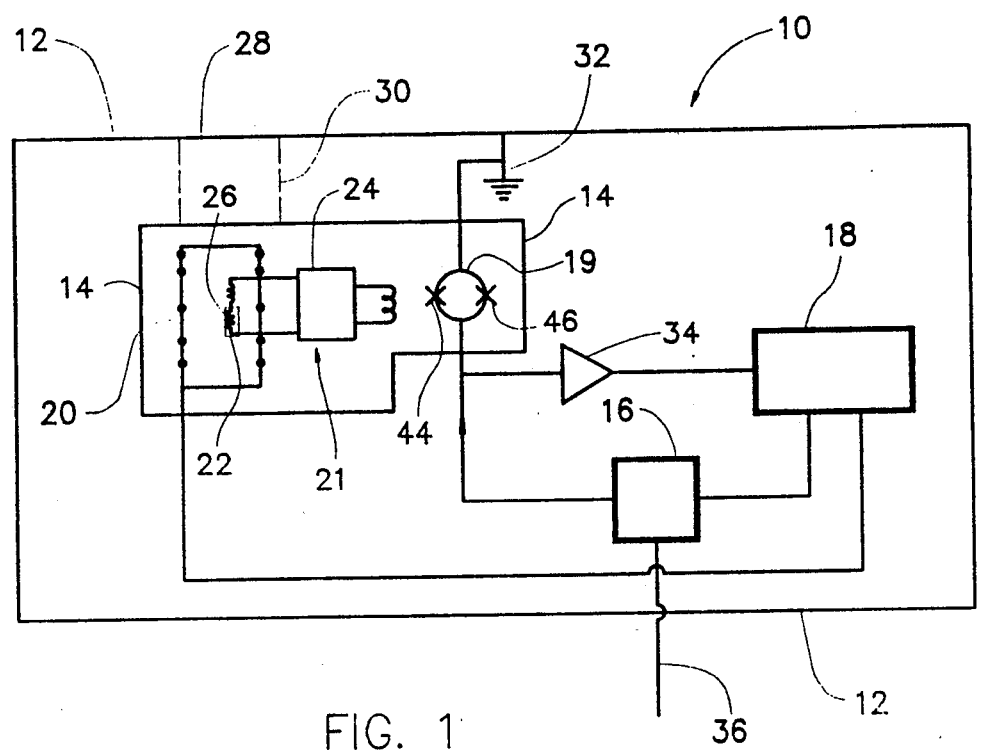
FIG. 1 is a block diagram of a Spectrometer incorporating a SQUID in accordance with the present application.

In FIG. 1, a NMR/NQR spectrometer 10 which operates at liquid nitrogen temperatures is shown within the confines of a portable box 12 which also constitutes the faraday shielding for the spectrometer.

Inside the spectrometer 10, a liquid nitrogen cryogen container 14, a dc power supply 16 and a computer 18 are arranged interconnected with each other.

In particular, the container 14 incorporates a high temperature dc SQUID 19 and a circuit arrangement 21. The circuit arrangement 21 (shown in detail in FIG. 2) comprises a dc magnet coil 20 around a sample area 22, a tuned circuit 24 for the observation of the frequencies of interest, and a sample coil 26 within the tuned circuit. An access cover 28 and access passage 30 in the box 12 is provided to allow a sample to be placed in the sample area 22.

One end of the SQUID 19 is connected to earth (see 32) while the other end of the SQUID 19 is connected to the computer 18 and power supply 16. In particular, the observed signal from the SQUID 19 passes through a preamplifier 34 for further amplification prior to reaching the computer 18 for firstly data acquisition and storage and secondly to control the pulsing of the dc magnetic field (by means of a magnet pulser). The computer 18 also includes a disk drive for the transfer of data for manipulation on a larger computer. The dc power supply 16 meanwhile is also connected to either a battery or mains (see 36).

The SQUID 19 in particular is a high temperature SQUID (i.e. above 77 K.) and is made from mixed oxides of a Lanthanide, copper and barium. The SQUID 19 consists of two high temperature Josephson Junctions 44 and 46.

The container 14 meanwhile holds liquid nitrogen at room temperatures because the container is a styrofoam container.

Figure 2:
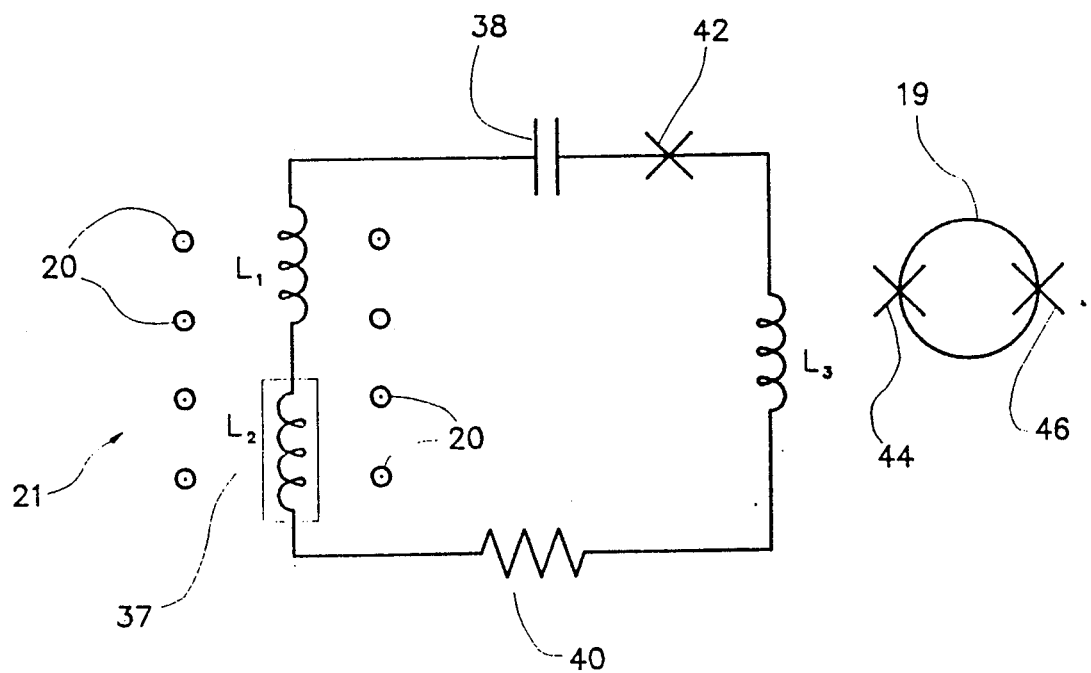
FIG. 2 is an enlarged view of the tuned circuit arrangement used in the Spectrometer shown in FIG. 1.

In FIG. 2, $L_3$ is the coil which creates the magnetic flux detected by the dc SQUID 19. $L_2$ is the sample coil (shown around a sample 37) and $L_1$ has the same number of turns arranged in an opposite manner as to negate any transient voltages created by the pulsing of the dc magnet coil 20. A further method of matching these coils may be necessary if the sample alters the inductance of $L_2$. A capacitor 38, resistor 40 and series high temperature Josephson Junction 42 are provided. The Josephson Junction 42 becomes resistive when the dc pulse is applied and so serves to protect the dc SQUID further. The dc SQUID is made from high temperature superconductors, and in particular is made from mixed oxides of a Lanthanide, copper and barium. The dc magnet coil 20, tuning circuit 24, sample 37 and dc SQUID 19 are all immersed in the liquid nitrogen cryostat.

The sample 37 would be placed in position by lowering through an opening at the top of the cryostat 16, which is also used to fill with liquid nitrogen. To protect the SQUID from stray radio frequency fields a cap must be placed over this orifice when the Spectrometer is in operation. Uses of such a Spectrometer would be envisaged to be in routine organic laboratories, hospitals (sample would be solid at 77° K.), and possibly in the field in such uses as oil exploration.

I claim:

1. A spectrometer which operates at liquid nitrogen temperatures comprising:
   a portable box constituting faraday shielding for said spectrometer;
   a container to hold a liquid nitrogen cryogen, wherein said container is situated within the confines of said box; and
   a high temperature direct current superconducting quantum interference device (SQUID) made from mixed oxides of a Lanthanide, copper and barium, wherein said SQUID is also situated within the confines of said box.

2. A spectrometer incorporating a superconducting quantum interference device (SQUID) made from mixed oxides of a Lanthanide, copper and barium.

3. A spectrometer as claimed in claim 2 which is a NMR Spectrometer.

4. A spectrometer as claimed in claim 2 which is a NQR Spectrometer.

5. A spectrometer as claimed in claim 2 which operates at liquid nitrogen temperatures.

6. A spectrometer as claimed in claim 2 including a container for a liquid nitrogen cryogen.

7. A spectrometer as claimed in claim 6 wherein said container is a styrofoam container to hold liquid nitrogen in a room temperature environment.

8. A spectrometer as claimed in either claim 6 or 7 wherein said container is within the confines of a portable box, which box also constitutes the faraday shielding.

9. A spectrometer as claimed in claim 1 wherein said SQUID is a high temperature direct current SQUID.

10. A spectrometer as claimed in claim 1 including a tuned circuit for the observation of frequencies of interest.

11. A spectrometer as claimed in claim 10 including a sample coil, within said tuned circuit.

12. A spectrometer as claimed in claim 2 including a dc magnet coil.

13. A spectrometer as claimed in claim 2 including a power supply.

14. A spectrometer as claimed in claim 2 including a preamplifier for further amplification of the observed signal.

15. A spectrometer as claimed in claim 12 including a small computer to control pulsing of the dc magnetic field produced by said magnet coil.

16. A spectrometer as claimed in claim 2 including a small computer for acquisition of data.

17. A spectrometer as claimed in claim 16 including a disk drive for transfer of said data for manipulation on a larger computer.

18. A spectrometer as claimed in claim 2 including a casing, which also screens said SQUID from stray radio frequency fields.

* * * * *